(12) United States Patent
Liu et al.

(10) Patent No.: US 9,064,868 B2
(45) Date of Patent: Jun. 23, 2015

(54) ADVANCED FARADAY SHIELD FOR A SEMICONDUCTOR DEVICE

(71) Applicant: GLOBALFOUNDRIES Inc., Grand Cayman (KY)

(72) Inventors: Yanxiang Liu, Wappinger Falls, NY (US); Vara Vakada, Beacon, NY (US); Jerome Ciavatti, Fishkill, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 40 days.

(21) Appl. No.: 13/650,233

(22) Filed: Oct. 12, 2012

(65) Prior Publication Data

US 2014/0103420 A1    Apr. 17, 2014

(51) Int. Cl.
*H01L 29/66* (2006.01)
*H01L 23/522* (2006.01)

(52) U.S. Cl.
CPC ..... *H01L 23/5225* (2013.01); *H01L 2924/0002* (2013.01)

(58) Field of Classification Search
CPC ............ H01L 23/60; H01L 2924/3025; H01L 2225/06537
USPC .......................................... 257/340, 386, 659
See application file for complete search history.

(56) References Cited

U.S. PATENT DOCUMENTS

| | | | |
|---|---|---|---|
| 4,839,594 A | 6/1989 | Misic et al. | |
| 5,291,152 A | 3/1994 | Seale | |
| 5,726,523 A | 3/1998 | Popov et al. | |
| 5,918,137 A * | 6/1999 | Ng et al. | 438/454 |
| 6,107,160 A * | 8/2000 | Hebert et al. | 438/454 |
| 6,215,152 B1 | 4/2001 | Hebert | |
| 6,420,952 B1 | 7/2002 | Redilla | |
| 6,472,723 B1 * | 10/2002 | Jarstad et al. | 257/659 |
| 6,534,843 B2 | 3/2003 | Acosta et al. | |
| 6,653,691 B2 | 11/2003 | Baliga | |
| 6,685,799 B2 | 2/2004 | Davis et al. | |
| 6,762,088 B2 | 7/2004 | Acosta et al. | |
| 7,119,415 B2 | 10/2006 | Norstrom et al. | |
| 7,223,321 B1 | 5/2007 | Comendant et al. | |
| 7,307,314 B2 | 12/2007 | Babcock et al. | |
| 7,413,673 B2 | 8/2008 | Lohokare et al. | |
| 7,446,003 B2 * | 11/2008 | Moscatelli et al. | 438/286 |
| 7,741,567 B2 | 6/2010 | Beddingfield et al. | |
| 7,796,403 B2 | 9/2010 | Coakley | |
| 8,049,119 B2 | 11/2011 | Beddingfield et al. | |
| 8,053,873 B2 | 11/2011 | Chauhan et al. | |
| 8,071,935 B2 | 12/2011 | Besko et al. | |

(Continued)

OTHER PUBLICATIONS

Brech et al., "Record Efficiency and Gain at 21 GHz of High Power RF Transistors for Cellular and 3G Base Stations," 2003 IEEE, pp. 359-362.

*Primary Examiner* — Jarrett Stark
*Assistant Examiner* — Mohammad M Hoque
(74) *Attorney, Agent, or Firm* — Amerson Law Firm, PLLC (57) ABSTRACT

One illustrative device disclosed herein includes a transistor comprising a gate electrode and a drain region formed in a semiconducting substrate, an isolation structure formed in the substrate, wherein the isolation structure is laterally positioned between the gate electrode and the drain region, and a Faraday shield that is positioned laterally between the gate electrode and the drain region and above the isolation structure, wherein the Faraday shield has a long axis that is oriented substantially vertically relative to an upper surface of the substrate.

16 Claims, 7 Drawing Sheets

(56) References Cited

U.S. PATENT DOCUMENTS

| | | | |
|---|---|---|---|
| 8,502,311 B2* | 8/2013 | Theeuwen | 257/340 |
| 8,648,410 B2* | 2/2014 | Coppens et al. | 257/327 |
| 8,823,096 B2* | 9/2014 | Su et al. | 257/340 |
| 2005/0087845 A1* | 4/2005 | Norstrom et al. | 257/659 |
| 2005/0280085 A1 | 12/2005 | Babcock et al. | |
| 2006/0128085 A1 | 6/2006 | Shibib et al. | |
| 2008/0128752 A1* | 6/2008 | Wu | 257/194 |
| 2009/0085112 A1* | 4/2009 | Ho et al. | 257/343 |
| 2009/0256199 A1* | 10/2009 | Denison et al. | 257/343 |
| 2011/0057271 A1* | 3/2011 | Ito et al. | 257/408 |
| 2011/0260302 A1* | 10/2011 | Bakalski et al. | 257/659 |
| 2011/0294273 A1* | 12/2011 | Birner et al. | 438/279 |
| 2012/0178211 A1* | 7/2012 | Hebert | 438/107 |
| 2013/0093012 A1* | 4/2013 | Zhang et al. | 257/335 |
| 2013/0134512 A1* | 5/2013 | Cheng et al. | 257/339 |
| 2013/0146973 A1* | 6/2013 | Mitra et al. | 257/335 |
| 2014/0054694 A1* | 2/2014 | Min et al. | 257/336 |

* cited by examiner

ADVANCED FARADAY SHIELD FOR A SEMICONDUCTOR DEVICE

BACKGROUND OF THE INVENTION

1. Field of the Invention

Generally, the present disclosure relates to the manufacture of sophisticated semiconductor devices, and, more specifically, to an advanced Faraday shield for a semiconductor device, such as an LDMOS device, and methods of making such a device.

2. Description of the Related Art

RF power amplifiers are key components in base stations, broadcast transmitters and microwave applications. Such power amplifiers can typically handle a wide range of signal types, such as GSM, EDGE, W-CDMA, WiMAX and DVB-T. LDMOS (Laterally Diffused Metal Oxide Semiconductor) devices have been the technology of choice for RF power amplifiers for over a decade because of their excellent power capabilities, gain, efficiency and reliability. In an RF LDMOS device, a Faraday shield is usually employed for two purposes: (1) to screen the gate for drain potential and to move the high electric field away from the gate edge in an attempt to mitigate hot carrier injection at the drain edge under the gate; and (2) to reduce the reverse transfer capacitance ($C_{gd}$—gate to drain capacitance), thereby improving RF performance. As device dimensions continue to shrink, it becomes very important to develop devices with better shielding characteristics that can be manufactured in a cost-efficient and timely manner.

Figure 1:
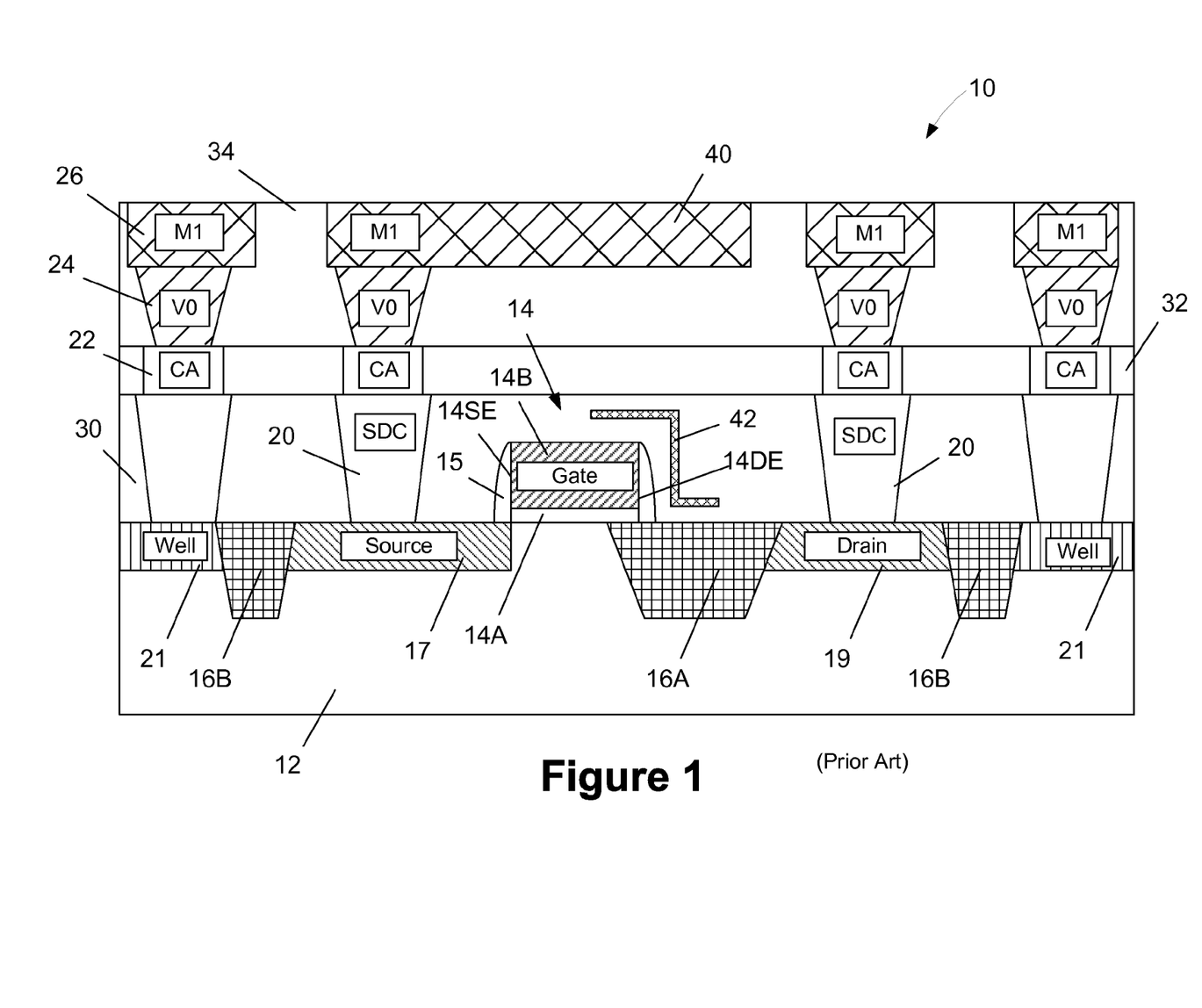
FIG. 1 is a cross-sectional view of one illustrative embodiment of a prior art LDMOS device.

FIG. 1 is a simplified cross-sectional view of an illustrative prior art LDMOS semiconductor device 10 at an early stage of manufacturing. The LDMOS device 10 may be either an N-type LDMOS device or a P-type LDMOS device. The LDMOS device 10 is formed above an illustrative bulk semiconducting substrate 12 that may be comprised of silicon or other semiconducting materials. The substrate 12 may also have a silicon-on-insulator (SOI) configuration that includes a bulk silicon layer, a buried insulation layer and an active layer, wherein semiconductor devices are formed in and above the active layer.

As shown in FIG. 1, the LDMOS device 10 has an illustrative gate structure 14 formed above the substrate 12. The gate structure 14 is generally comprised of a gate insulation layer 14A and a gate electrode 14B, both of which may be comprised of a variety of materials and manufactured using a variety of known techniques. For example, the gate insulation layer 14A may be comprised of a variety of different materials, such as, for example, silicon dioxide, a so-called high-k (k greater than 10) insulation material, etc. Similarly, the gate electrode 14B may also be of a material such as polysilicon or amorphous silicon, or it may be comprised of one or more metal layers that act as the gate electrode 14B. Illustrative sidewall spacers 15 comprised of, for example, silicon nitride are typically formed adjacent the gate electrode structure 14 to protect and electrically isolate the gate electrode structure. The gate electrode 14B of the gate structure 14 has a source-side edge 14SE and a drain-side edge 14DE. A plurality of doped regions are formed in the substrate 12 as is customary for LDMOS devices, e.g., a source region 17, a drain region 19 and well contact regions 21. The device 10 also includes a plurality of isolation structures, e.g., trench isolation structures, formed in the substrate 10. More specifically, drain isolation region 16A separates the gate and the drain region 19, while the isolation regions 16B are positioned between the doped source/drain regions 17, 19 and the well contact regions 21.

Various conductive structures are formed in multiple layers of insulating material to provide electrical connection to various doped regions and structures of the LDMOS device 10. In the depicted example, the device 10 includes a plurality of conductive structures that are conductively coupled to the source/drain regions 17, 19 and the well contact regions 21 of the LDMOS device 10, namely source/drain region conductors ("SDC") 20, source/drain contacts 22 ("CA"), so-called via zero ("V0") 24 and metal-1 ("M1") 26 conductive structures. Within the industry, the first general wiring layer for the integrated circuit product is typically designated "M1" and the source/drain region conductors 20 may sometimes be referred to as "trench silicide" regions. In the depicted example, the conductive structures are positioned in illustrative first, second and third layers of insulating material 30, 32, 34, respectively.

Also depicted in FIG. 1 is an "M-1" type Faraday shield 40 that extends laterally beyond the drain side edge 14DE of the gate electrode toward the drain region 19. Also schematically depicted in FIG. 1 is a so-called "WSi" type of shield 42 for the LDMOS device 10. In some cases, prior art LDMOS devices did not employ both types of shields. One purpose of the shields 40, 42 is to reduce the gate-to-drain ("Cgd") capacitance so as to increase the RF performance and the switching speed of the LDMOS device. Additionally, the shields 40, 42 screen the gate from the potential applied to the drain 19 and effectively move the high electric field produced by the drain potential laterally away from the gate toward the drain region 19, which tends to reduce adverse hot carrier injection at the drain side edge 14DE of the gate electrode 14.

The present disclosure is directed to an advanced Faraday shield for a semiconductor device and methods of making such a device.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to an advanced Faraday shield for a semiconductor device, such as an LDMOS device, and methods of making such a device. One illustrative device disclosed herein includes a transistor comprising a gate electrode and a drain region formed in a semiconducting substrate, an isolation structure formed in the substrate, wherein the isolation structure is laterally positioned between the gate electrode and the drain region, and a Faraday shield that is positioned laterally between the gate electrode and the drain region and above the isolation structure, wherein the Faraday shield has a long axis that is oriented substantially vertically relative to an upper surface of the substrate.

In another illustrative example, a device is disclosed that includes a transistor comprising a gate electrode and a drain region formed in a semiconducting substrate, a source/drain conductor that is conductively coupled to the drain region, a source/drain contact that is positioned above and conductively coupled to the source/drain conductor, an isolation structure formed in the substrate, wherein the isolation structure is laterally positioned between the gate electrode and the drain region, and a Faraday shield that is positioned laterally between the gate electrode and the drain region, wherein the Faraday shield is comprised of conductive features corresponding to the source/drain conductor and the source/drain contact.

In yet another example, a novel device disclosed herein includes a transistor comprising a gate electrode and a drain region formed in a semiconducting substrate, a metal-1 metallization layer, a plurality of drain conductive structures that are positioned below the metal-1 metallization layer and conductively coupled to the drain region, an isolation structure formed in the substrate, wherein the isolation structure is laterally positioned between the gate electrode and the drain region, and a Faraday shield that is positioned laterally between the gate electrode and the drain region, wherein the Faraday shield is comprised of conductive features corresponding to the drain conductive structures.

In yet a further example, a novel device disclosed herein includes a transistor comprising a gate electrode and a drain region formed in a semiconducting substrate, a metal-1 metallization layer comprising a metal-1 type Faraday shield that is positioned above the gate electrode, an isolation structure formed in the substrate, wherein the isolation structure is laterally positioned between the gate electrode and the drain region, and a Faraday shield that is positioned laterally between the gate electrode and the drain region and above the isolation region, the Faraday shield being conductively coupled to the metal-1 type Faraday shield.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure is directed to an advanced Faraday shield for a semiconductor device and methods of making such a device. As will be readily apparent to those skilled in the art upon a complete reading of the present application, the present method is applicable to a variety of semiconductor devices, including, but not limited to, LDMOS devices, microwave transistors, power amplifiers (both N-type and P-type versions of such devices), and the use of such semiconductor devices in a variety of applications, such as, for example, RF/microwave power amplifiers, avionics, radar transmission systems, cellular base stations, etc. The inventions disclosed herein will be described with reference to a generic LDMOS device, however, as noted above, the inventions disclosed herein have wide application and they may be employed in a variety of different semiconductor devices. Thus, the inventions disclosed herein should not be limited to any particular type of semiconductor device or any particular application. With reference to the attached drawings, various illustrative embodiments of the devices and methods disclosed herein will now be described in more detail.

Figure 2A:
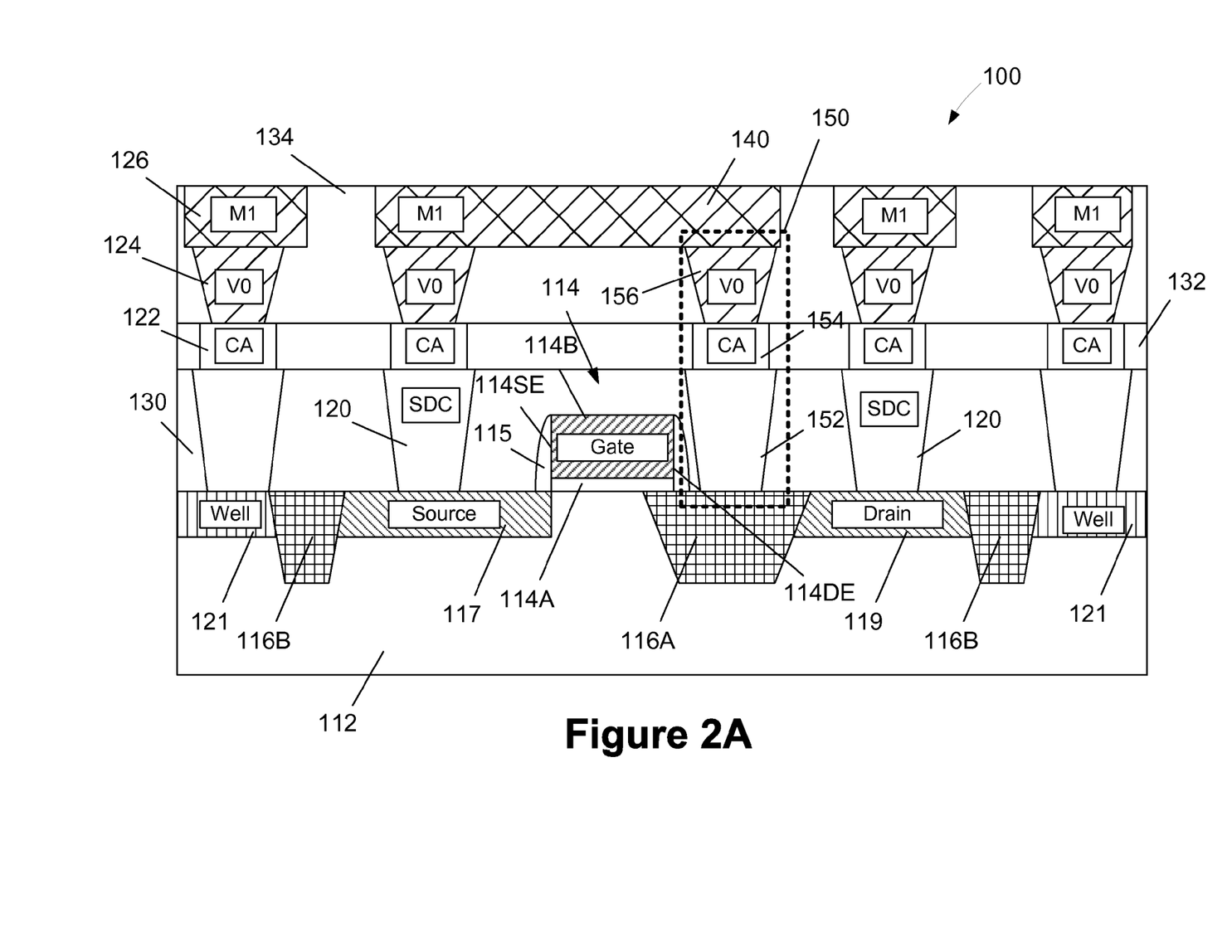
FIGS. 2A-2G are various views of one illustrative embodiment of a semiconductor device with an illustrative embodiment of the novel Faraday shield disclosed herein.

FIGS. 2A-2G depict various aspects of an illustrative LDMOS semiconductor device 100. The LDMOS device 100 may be either an N-type or a P-type LDMOS device. As shown in FIG. 2A, the LDMOS device 100 is formed above an illustrative bulk semiconducting substrate 112 that may be comprised of silicon or other semiconducting materials. The substrate 112 may also have a silicon-on-insulator (SOI) configuration that includes a bulk silicon layer, a buried insulation layer and an active layer, wherein semiconductor devices are formed in and above the active layer. Thus, the terms "substrate" or "semiconducting substrate" should be understood to cover all forms of semiconductor materials and structures. The illustrative LDMOS device 100 depicted herein is intended to be representative in nature of any of a variety of different configurations and variations of LDMOS devices that are generally known to those skilled in the art. As noted above, after a complete reading of the present application, those skilled in the art will readily appreciate that the inventions disclosed herein may be applied to any of a variety of different semiconductor designs. Accordingly, the present inventions should not be considered as limited to any type or configuration of any particular type of semiconductor device.

As shown in FIG. 2A, the device 100 has an illustrative gate structure 114 formed above the substrate 112. The gate structure 114 is generally comprised of a gate insulation layer 114A and a gate electrode 114B, both of which may be comprised of a variety of materials and manufactured using a variety of known techniques. For example, the gate insulation layer 114A may be comprised of a variety of different materials, such as, for example, silicon dioxide, a so-called high-k (k greater than 10) insulation material, etc. Similarly, the gate electrode 114B may also be of a material such as polysilicon or amorphous silicon, or it may be comprised of one or more metal layers that act as the gate electrode 114B. As will be recognized by those skilled in the art after a complete reading of the present application, the gate structure 114 depicted in the drawings, i.e., the gate insulation layer 114A and the gate electrode 114B, is intended to be representative in nature. That is, the gate structure 114 may be comprised of a variety of different materials and they may have a variety of configurations, and the gate structure 114 may be made using either so-called "gate-first" or "gate-last" techniques. The materials of construction for the gate structure 114 for an N-type LDMOS device may be different than those employed on the P-type LDMOS device. Illustrative sidewall spacers 115 comprised of, for example, silicon nitride are typically formed adjacent the gate structure 114 to protect and electrically isolate the gate electrode 114B. The gate electrode 114B has a source-side edge 114SE and a drain-side edge 114DE.

A plurality of doped regions are formed in the substrate 112 as is customary for LDMOS devices, e.g., a source region 117, a drain region 119 and well contact regions 121. The various doped regions may be formed by using various masking layers and performing various ion implantation processes, all of which are known to those skilled in the art. The device 100 also includes a plurality of isolation structures, e.g., trench isolation structures, formed in the substrate 112. More specifically, the device 100 includes a drain isolation region 116A that separates the gate and the drain region 119, and a plurality of contact isolation regions 116B that are positioned between the doped source/drain regions 117, 119 and the well contact regions 121. In one illustrative example, the drain isolation region 116A may have a lateral width (at the upper surface of the substrate 112) that falls within the range of about 50-500 nm.

As shown in FIG. 2A, the device 100 also includes a plurality of source/drain region conductors 120 (SDC) that are positioned in a first layer of insulating material 130. The source/drain conductors 120 are conductively coupled to the source/drain regions 117, 119 of the LDMOS device 100 and they may be formed using traditional fabrication techniques. Within the industry, the source/drain region conductors 120 may sometimes be referred to as "trench silicide" regions. As will be recognized by those skilled in the art after a complete reading of the present application, the source/drain region conductors 120 may be of any shape or configuration and they may be comprised of any material as long as they provide a conductive connection to the source/drain regions 117, 119. The source/drain region conductors 120 may be comprised of a variety of conductive materials, e.g., tungsten, titanium nitride, a metal silicide, etc. The size, shape and number of the source/drain region conductors 120 may vary depending upon the particular application. For example, the source/drain region conductors 120 may be discrete post-type structures having a generally rectangular or circular cross-sectional configuration when viewed from above, or they may take the form of a continuous line-type feature that runs in the gate width direction.

In one illustrative embodiment, a plurality of source/drain contacts 122 (CA) are formed in a second layer of insulating material 132 that is positioned above the first layer of insulating material 130. The source/drain contacts 122 are conductively coupled to the source/drain conductors 120. As with the source/drain conductors 120 discussed above, the source drain contacts 122 may be comprised of any desired conductive material, e.g., any metal, and they may have any desired configuration, e.g., round, square, a line, etc. The second layer of insulating material 132 may be comprised of a different material than that of the first layer of insulating material 130, although that is not required to practice at least some aspects of the present invention. In one illustrative embodiment, the second layer of insulating material 132 may be a layer of silicon nitride, while the first layer of insulating material 130 may be made of silicon dioxide. The second layer of insulating material 132 may serve a variety of purposes in addition to its general insulation function. For example, the second layer of insulating material 132 may be used as a polish-stop layer or an etch stop layer in subsequent processing operations that are performed to form various conductive structures for the device 100.

Also depicted in FIG. 2A are a plurality of conductive vias 124 ("V0") and a plurality of metal-1 portions or lines 126 ("M1") that are formed in a layer of insulating material 134 using known techniques. The metallization layer containing the lines 126 is believed to be generally known in the industry as the so-called "metal-1" metallization layer. The conductive lines and structures formed in the metal-1 layer are generally used to establish electrical conductivity over relatively long distances on an integrated circuit product. The conductive vias 124 and conductive lines 126 may be comprised of a variety of different materials, e.g., copper, tungsten, etc. In the illustrative embodiment depicted in FIG. 2A, the metal-1 layer includes an illustrative M-1 type Faraday shield 140, although an M-1 type Faraday shield 140 may not be employed or needed in all applications. That is, the novel Faraday shield structure disclosed herein may be employed with or without other forms of shielding structures, such as the illustrative M-1 type Faraday shield 140 depicted in FIG. 2A. As with the source/drain conductors 120 discussed above, the vias 124 and lines 126 may be comprised of any desired conductive material, e.g., any metal, and they may have any desired configuration, e.g., round, square, a line, etc.

Figure 2B:
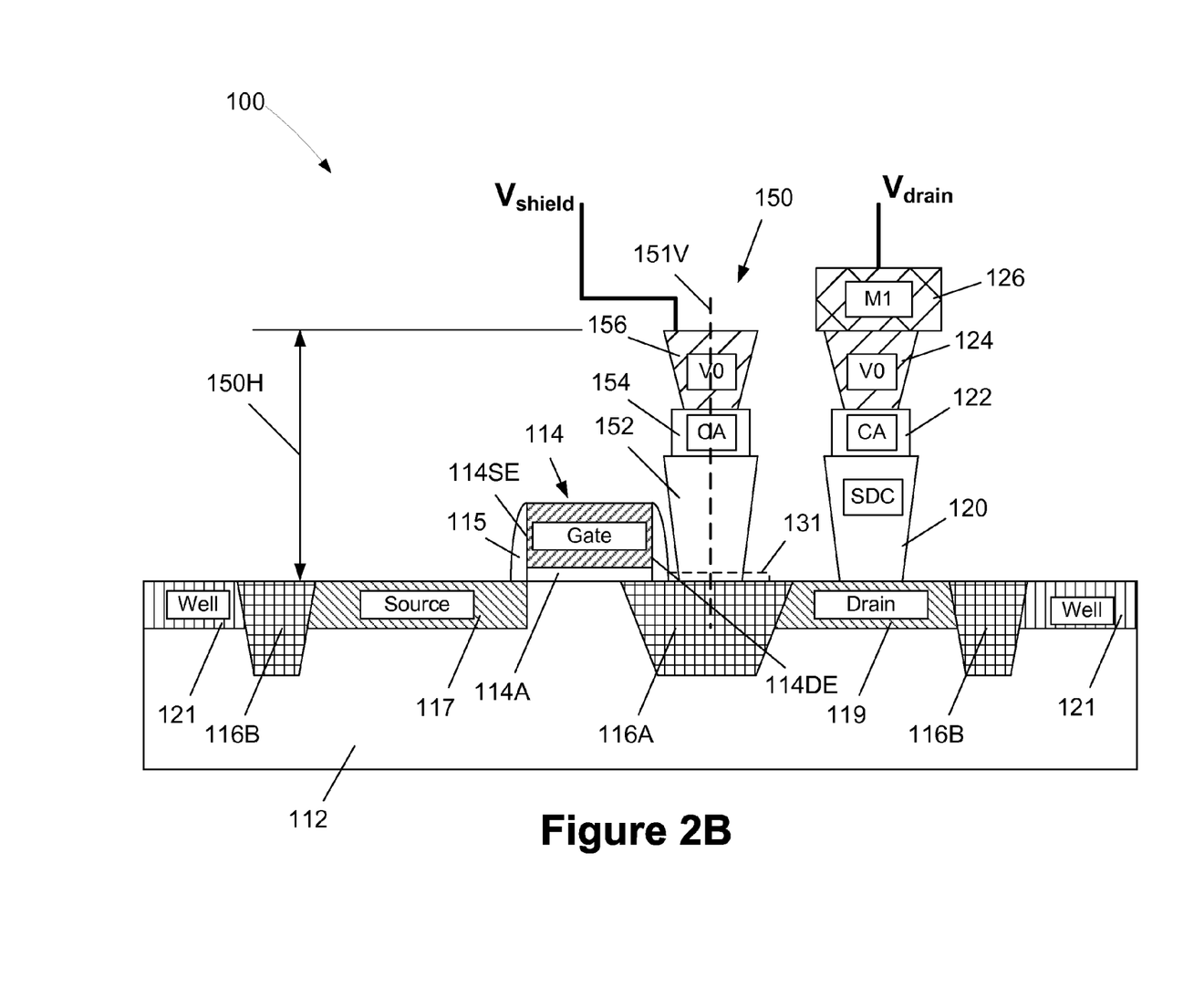

With reference to FIGS. 2A-2B, one illustrative embodiment of the advanced Faraday shield 150 disclosed herein will be further described. In one specific embodiment, the Faraday shield 150 may be comprised of a plurality of vertically stacked conductive features or structures, the collection of which have a substantially vertically oriented long axis 151V. In a more specific embodiment, the Faraday shield 150 may be comprised of a plurality of conductive features that correspond to, i.e., have the same structure and configuration, as the conductive features that are conductively coupled to the source region 117 and the drain region 119. For example, the Faraday shield 150 disclosed herein may be comprised of the same conductive features that are formed below the metal-1 level to establish electrical contact to the source region 117 and the drain region 119. More specifically, in the embodiment depicted in the drawings, the features 152, 154, 156 have the same structure and configuration as the source/drain conductors 120, the source/drain contacts 122 and the vias 124, respectively.

In the depicted example, the Faraday shield 150 is comprised of three levels of stacked conductive features, i.e., a plurality of conductive features 152, 154, 156, that are positioned between the drain side edge 114DE of gate electrode 114B and the drain region 119 and it has a long axis that is oriented in a substantially vertical axis 151V relative to the upper surface of the substrate 112. In the depicted example, the Faraday shield 150 is positioned above the drain isolation region 116A that is positioned between the drain region 119 and the gate structure 114. In some cases, the Faraday shield may actually land on and contact the drain isolation region 116A, but such contact may not be required in all applications. In other applications, the Faraday shield 150 may not actually contact the drain isolation region 116A as it may contact a layer of insulating material positioned above the drain isolation region 116A (a portion of which is shown in dashed lines 131 in FIG. 2B) that may be part of a liner layer or a layer of spacer material, etc. That is, in some embodiments, the Faraday shield 150 may land on insulating material positioned between the conductive structure 152 and the drain isolation region 116A. In one example, as depicted in FIG. 2A, through use of the M-1 type Faraday shield 140, the voltage applied to the novel shield 150 ($V_{shield}$) disclosed herein is the same voltage that is applied to the source region 117 ($V_{source}$). FIG. 2B depicts an embodiment of the device 100 with many of the features depicted in FIG. 2A omitted so as not to obscure the presently disclosed inventions. More specifically, as shown in FIG. 2B, the shield 150 disclosed herein may be a "stand-alone" type shield that may be employed without the illustrative M-1 type Faraday shield 140 depicted in FIG. 2A. FIG. 2A also reflects that the shield 150 disclosed herein need not be coupled to the source voltage ($V_{source}$). Rather, as will be recognized by those skilled in the art after a complete reading of the present application, the shield voltage ($V_{Shield}$) only needs to be lower than the drain voltage ($V_{Drain}$).

In general, the novel shield 150 disclosed herein may be of any desired vertical height 150H and it may run substantially parallel to the gate electrode 114B for substantially the entire gate width of the transistor, although it need not be continuous along the gate width direction. As noted above, the shield 150 is comprised of three levels of conductive features, e.g., conductive features 152, 154 and 156. However, the novel shield 150 disclosed herein may be comprised of any desired number of levels of conductive features or even a single level of conductive features. In the illustrative embodiment depicted in FIG. 2A, the conductive features 152, 154, 156 define a dead-leg that is conductively coupled to the illustrative M-1 type Faraday shield 140.

As will be recognized by those skilled in the art after a complete reading of the present application, any number of the conductive features 152, 154, 156 may be employed to form the shield 150, they may be of any desired shape or configuration and they may be comprised of any conductive material, e.g., tungsten, titanium nitride, etc. As noted above, in the specific embodiment disclosed herein, the features 152, 154, 156 have the same structure and configuration as the source/drain conductors 120, the source/drain contacts 122 and the vias 124, respectively. However, in other embodiments, the Faraday shield 150 may be made of conductive features that correspond to one or more conductive features or contacts (not shown) that electrically contact the gate electrode 114B. In the embodiment depicted in FIG. 2A, the M-1 Faraday shield 140 is conductively coupled to the shield 150 by virtue of the via 156. However, as noted above, the illustrative M-1 type Faraday shield 140 may not be provided in all applications. In cases where the M-1 type Faraday 140 shield is provided, the shield 150 disclosed herein may be conductively coupled to the M-1 type shield, but that is not required in all applications. Even in cases where the device 100 does include an M-1 type Faraday shield 140, it is not required that the shield 150 disclosed herein be conductively coupled to the M-1 type Faraday shield 140. In the specific example shown in FIG. 2A, the shield 150 is conductively coupled to the same voltage level as is applied to the source region 117.

Figure 2C:
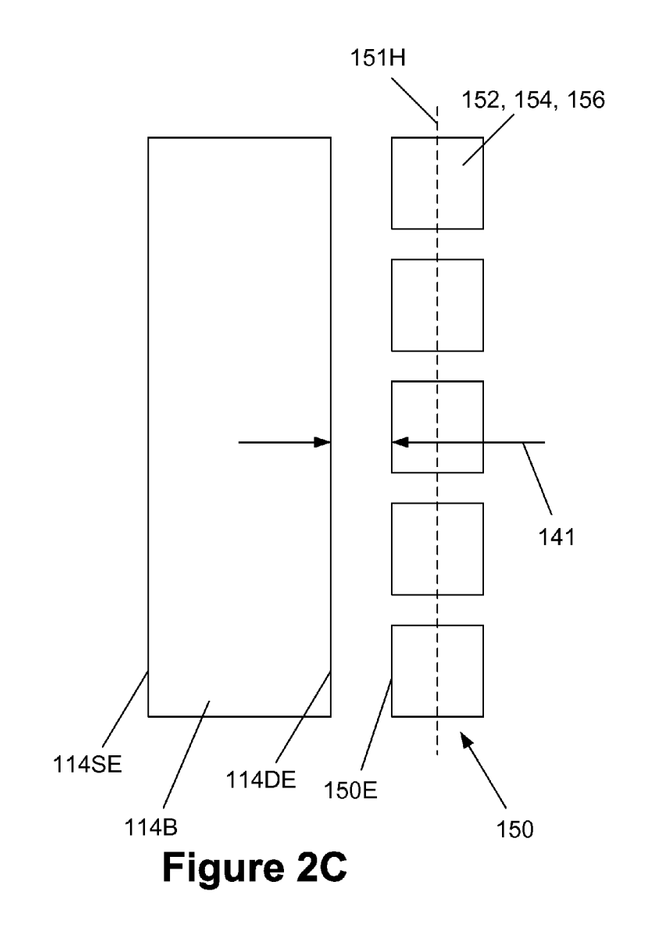
Figure 2D:
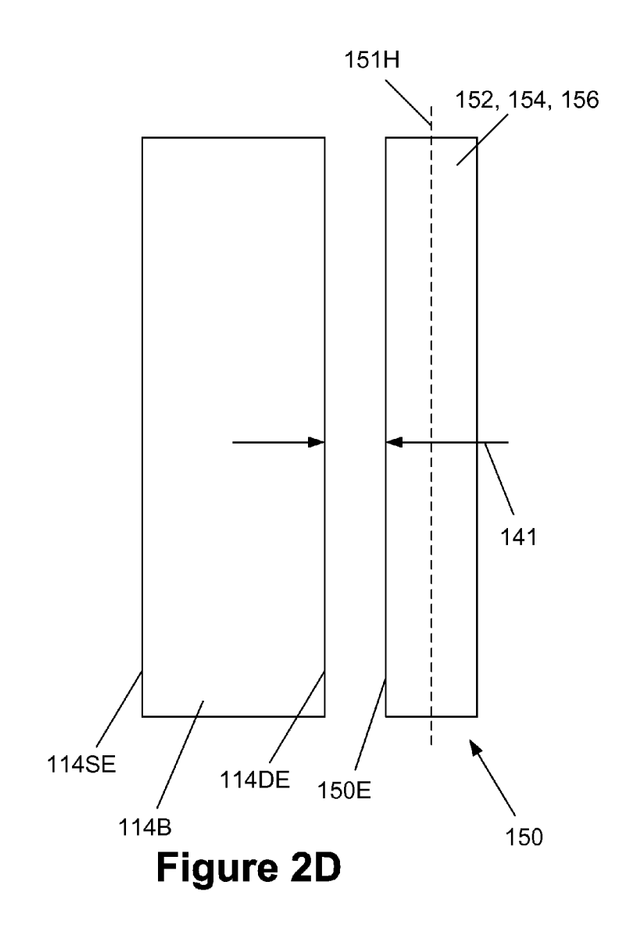

FIGS. 2C-2D are plan views of the gate electrode 114B and illustrative embodiments of the conductive features 152, 154, 156 that define the shield 150. As shown in FIG. 2C, the shield has a horizontal axis 151H that is approximately parallel to the long axis of the gate electrode 114B. The inner edge 150E of the shield 150 may be spaced away from the drain-side edge 114DE of the gate electrode 114B by a lateral distance 141 that may fall within the range of about 20-500 nm.

As shown in FIG. 2C, the conductive features 152, 154, 156 may take the form of a plurality of discrete, spaced-apart individual features having, for example, a generally square configuration. In FIG. 2D, the conductive features 152, 154, 156 have a continuous line-type configuration. Of course, in certain embodiments, the conductive features 152, 154, 156 may be formed such that one or more levels are discrete features, while another level is comprised of line-type features, as described more fully below.

Figure 2E:
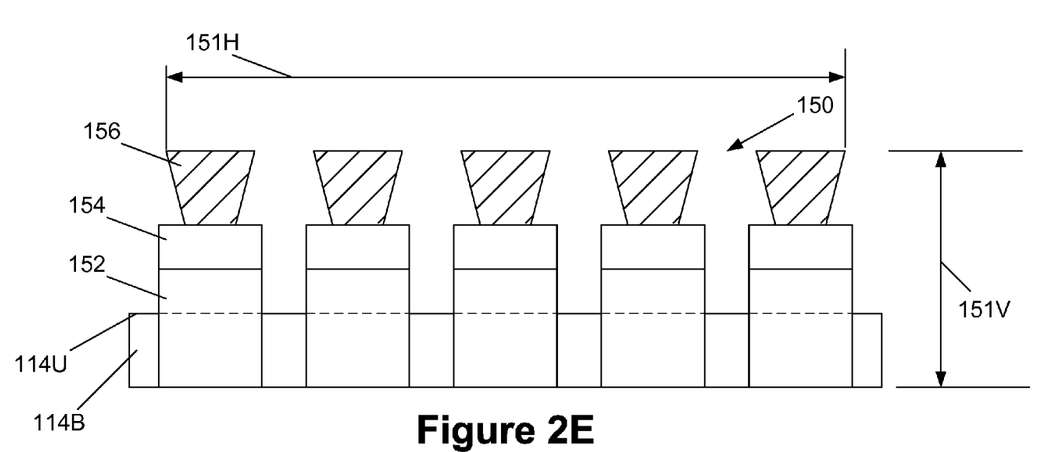
Figure 2F:
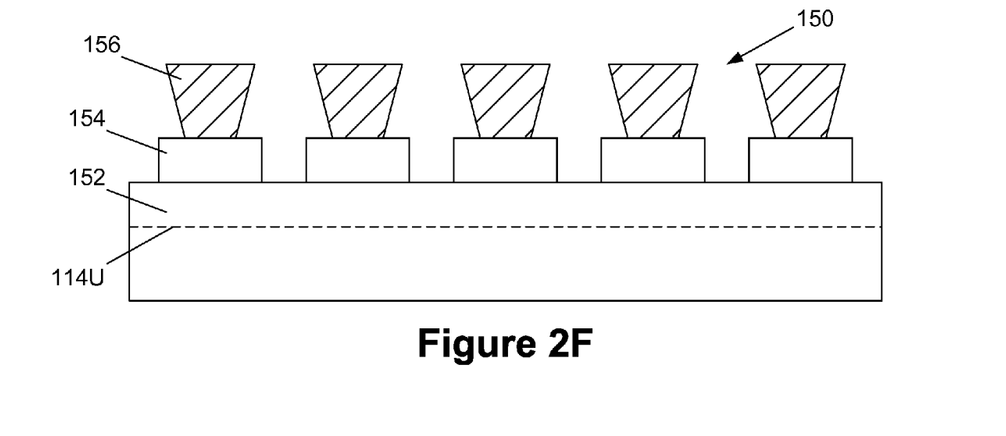
Figure 2G:
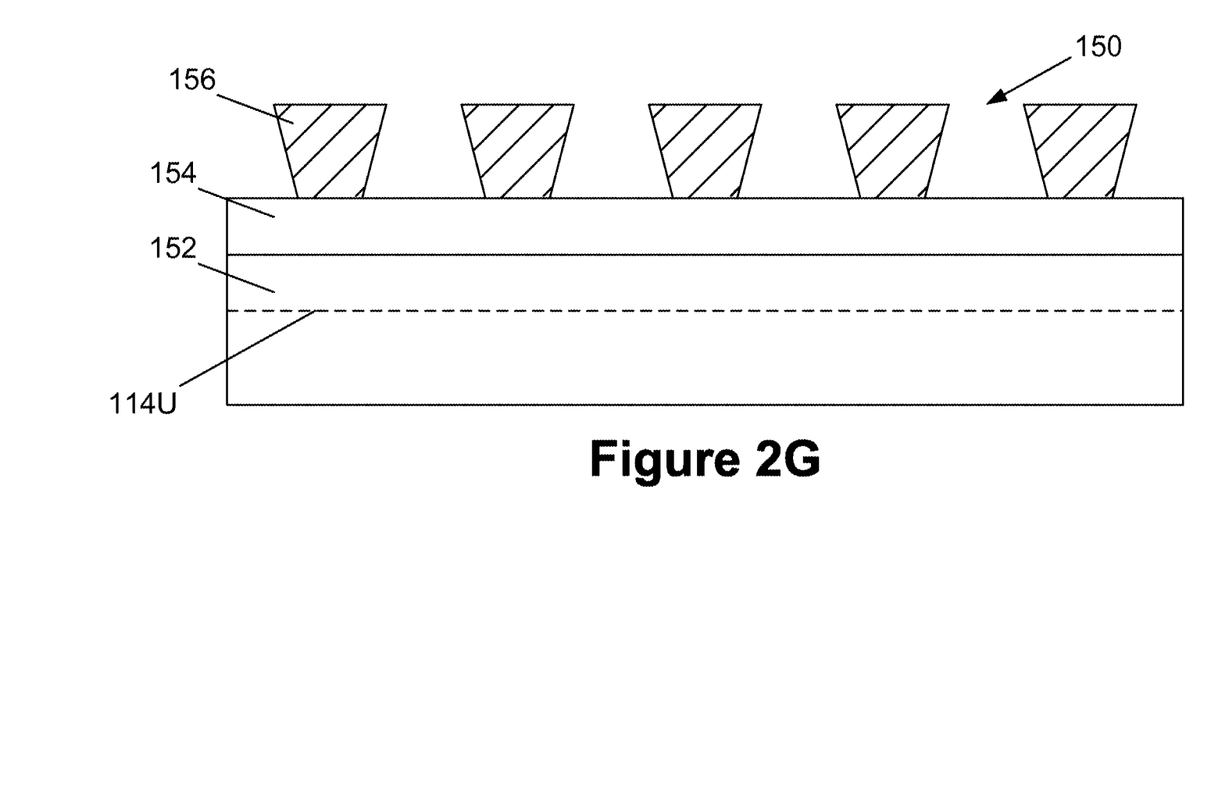

FIGS. 2E-2G are side views of the Faraday shield 150 disclosed herein taken from the drain region 119 looking back toward the gate structure 114, with the various layers of insulating material removed. The upper surface 114U of the gate electrode 114 is depicted in FIGS. 2E-2G for reference purposes. As indicated above, the conductive features 152, 154, 156 may be of any shape or configuration. FIG. 2E depicts the illustrative example where each level of the shield 150 is comprised of a plurality of discrete, individual conductive members that are effectively stacked on top of one another. In this example, the conductive features 152, 154, 156 may have a generally rectangular cross-sectional configuration. Note that, in the example depicted in FIG. 2E, there are physical gaps in the shield along its horizontal length 151H.

In FIG. 2F, the first level of the shield 150 is comprised of a conductive feature 152 that is a continuous line-type feature while the second and third levels of the shield, i.e., conductive features 154, 156, are discrete individual conductive contacts. In the embodiment depicted in FIG. 2F, the conductive feature 152 extends in the gate width direction a sufficient distance so as to shield the entire gate electrode 114B in the gate width direction. In FIG. 2G, the first and second levels of the shield 150, i.e., the conductive features 152, 154, are continuous line-type features, while the third level of the shield 150 is comprised of a plurality of conductive features 156 that are discrete individual conductive contacts. Thus, as will be appreciated by those skilled in the art after a complete reading of the present application, the presently disclosed inventions may be implemented in a variety of different configurations.

Figure 3:
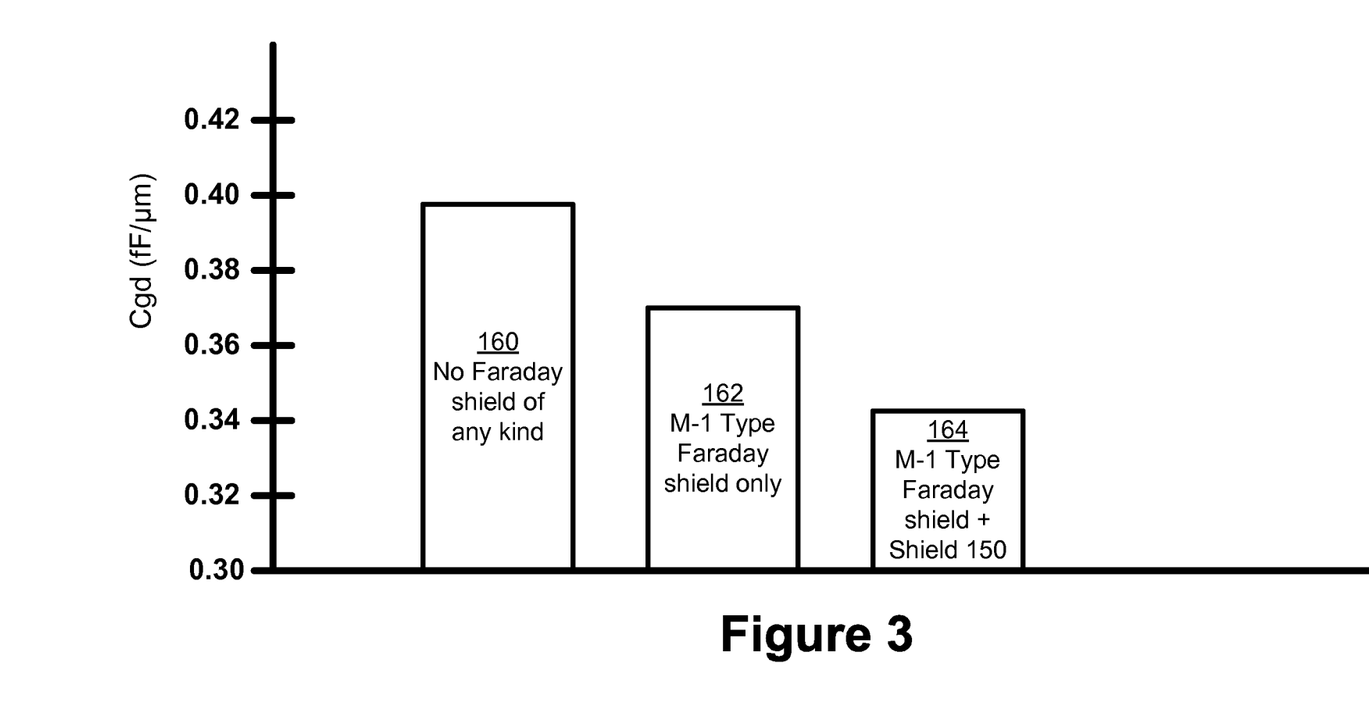
FIG. 3 is a graphical depiction of the simulation results that demonstrate the effectiveness of one illustrative embodiment of the novel Faraday shield disclosed herein.

FIG. 3 graphically depicts the results of simulations of the device 100 disclosed herein. Three situations were modeled: (1) condition 160—an LDMOS device without a Faraday shield of any kind; (2) condition 162—an LDMOS device that includes a traditional M-1 type Faraday shield only (i.e., a shield created by extending the metal-1 wiring layer above the gate electrode); and (3) condition 164—an LDMOS device as depicted in FIG. 2A that includes an M-1 type Faraday shield 140 plus the novel shield 150 disclosed herein. The bias conditions in the simulation were Vg=Vs=0V and Vd=5V. The gate-to-drain capacitance (Cgd in fF/µm) for each of the conditions 160, 162, 164 were 0.397, 0.372 and 0.343, respectively. The simulation revealed that in condition 160 (no Faraday shielding at all), there was a strong potential gradient on the top and drain side of the gate structure 114, which is indicative of severe gate-to-drain coupling. In condition 162 (M-1 type Faraday shield only), the M-1 type Faraday shield eliminated much of the potential gradient on top of the gate structure 114, but a significant gradient still existed at the drain-side edge 114DE of the gate structure 114. In condition 164 (M-1 type Faraday shield+the shield 150 disclosed herein), both the top and side potential gradients were more effectively shielded. As a result, using the novel shield 150 disclosed herein greatly reduces the gate-to-drain capacitance for the device 100. More specifically, simulated comparison of the condition 164 to the condition 162 reveals that the use of the novel shield 150 disclosed herein reduces the gate-to-drain capacitance by about 8% ((0.372–0.343)/0.372=0.7796).

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. An integrated circuit device, comprising:
    a transistor comprising a gate electrode and a drain region formed in a semiconducting substrate;
    an isolation structure formed in said substrate, said isolation structure being laterally positioned between said gate electrode and said drain region; and
    a Faraday shield that is positioned laterally between said gate electrode and said drain region and above said isolation structure, wherein said Faraday shield is comprised of a plurality of vertically stacked conductive features, wherein each of said plurality of vertically stacked conductive features is positioned in a separate layer of insulating material.

2. The device of claim 1, wherein said plurality of vertically stacked conductive features are discrete, separated conductive contacts or continuous line-type features.

3. The device of claim 1, wherein said plurality of vertically stacked conductive features is comprised of three levels of conductive features and wherein each of said three levels is comprised of a plurality of discrete, separated conductive contacts or at least one continuous line-type feature.

4. The device of claim 1, further comprising a source/drain conductor that is conductively coupled to said drain region, a source/drain contact that is conductively coupled to said source/drain conductor and wherein said plurality of vertically stacked conductive features correspond to said source/drain conductor and said source/drain contact.

5. The device of claim 1, further comprising a metal-1 layer that contains a metal-1 type Faraday shield that is positioned above said gate electrode.

6. The device of claim 5, wherein said Faraday shield is conductively coupled to said metal-1 type Faraday shield.

7. The device of claim 5, wherein said device further comprises a source region formed in said substrate, and wherein said Faraday shield and said metal-1 type Faraday shield are conductively coupled to said source region.

8. An integrated circuit device, comprising:
    a transistor comprising a gate electrode and a drain region formed in a semiconducting substrate;
    a source/drain conductor that is conductively coupled to said drain region, said source/drain conductor having a structure and configuration;
    a source/drain contact that is positioned above and conductively coupled to said source/drain conductor, said source/drain contact having a structure and configuration;
    an isolation structure formed in said substrate, said isolation structure being laterally positioned between said gate electrode and said drain region;
    a Faraday shield that is positioned laterally between said gate electrode and said drain region, wherein said Faraday shield is comprised of first, second and third vertically stacked conductive features, wherein said first vertically stacked feature has the same structure and configuration as said said source/drain conductor and said second vertically stacked feature has the same structure and configuration as said source/drain contact; and
    a conductive via that is conductively coupled to said source/drain contact, said conductive via having a structure and configuration, wherein said third vertically stacked conductive feature of said Faraday shield has the same structure and configuration as said conductive via.

9. The device of claim 8, further comprising a metal-1 layer that contains a metal-1 type Faraday shield that is positioned above said gate electrode.

10. The device of claim 9, wherein said Faraday shield is conductively coupled to said metal-1 type Faraday shield.

11. The device of claim 8, wherein said Faraday shield contacts said isolation structure.

12. The device of claim 8, wherein said Faraday shield contacts an insulating material positioned between said Faraday shield and said isolation structure.

13. The device of claim 9, wherein said Faraday shield is positioned above said isolation region and wherein said Faraday shield has a long axis that is oriented substantially vertically relative to an upper surface of said substrate.

14. An integrated circuit device, comprising:
    a transistor comprising a gate electrode and a drain region formed in a semiconducting substrate;
    a metal-1 metallization layer that comprises a metal-1 type Faraday shield that is positioned above said gate electrode;
    a plurality of drain conductive features that are positioned below said metal-1 metallization layer and conductively coupled to said drain region, wherein said plurality of drain conductive features collectively have a structure and configuration;
    an isolation structure formed in said substrate, said isolation structure being laterally positioned between said gate electrode and said drain region; and
    a Faraday shield that is positioned laterally between said gate electrode and said drain region and contacts said isolation region, wherein said Faraday shield is conductively coupled to said metal-1 type Faraday shield and wherein said Faraday shield is comprised of vertically stacked conductive features drain conductive features that collectively have the same structure and configuration as said plurality of drain conductive features.

15. The device of claim 14, wherein said Faraday shield is conductively coupled to a source region formed in said substrate.

16. An integrated circuit device, comprising:
    a transistor comprising a gate electrode and a drain region formed in a semiconducting substrate;
    a source/drain conductor that is conductively coupled to said drain region, said source/drain conductor having a structure and configuration;
    a source/drain contact that is positioned above and conductively coupled to said source/drain conductor, said source/drain contact having a structure and configuration;

an isolation structure formed in said substrate, said isolation structure being laterally positioned between said gate electrode and said drain region; and a Faraday shield that is positioned laterally between said gate electrode and said drain region, wherein said Faraday shield is comprised of first and second vertically stacked conductive features, wherein said first vertically stacked feature has the same structure and configuration as said source/drain conductor and said second vertically stacked feature has the same structure and configuration as said source/drain contact, wherein said Faraday shield contacts an insulating material positioned between said Faraday shield and said isolation structure.

* * * * *